US010893255B2

(12) United States Patent
Kyung et al.

(10) Patent No.: US 10,893,255 B2
(45) Date of Patent: *Jan. 12, 2021

(54) CAMERA SYSTEM FOR INCREASING BASELINE

(71) Applicant: CENTER FOR INTEGRATED SMART SENSORS FOUNDATION, Daejeon (KR)

(72) Inventors: Chong Min Kyung, Daejeon (KR); Seung Hyuk Chang, Daejeon (KR)

(73) Assignee: Center For Integrated Smart Sensors Foundation, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/412,092

(22) Filed: May 14, 2019

(65) Prior Publication Data

US 2019/0356901 A1 Nov. 21, 2019

(30) Foreign Application Priority Data

May 15, 2018 (KR) .................. 10-2018-0055407

(51) Int. Cl.
*H04N 13/207* (2018.01)
*H04N 5/225* (2006.01)

(52) U.S. Cl.
CPC ......... *H04N 13/207* (2018.05); *H04N 5/2253* (2013.01); *H04N 5/2254* (2013.01)

(58) Field of Classification Search
CPC .. H04N 13/207; H04N 5/2253; H04N 5/2254; H04N 5/36965; H04N 5/335; H04N 13/271; H04N 2013/0081; H01L 27/14625; H01L 27/14641; H01L 27/14627; H01L 27/14605; H01L 27/14623

See application file for complete search history.

(56) References Cited

U.S. PATENT DOCUMENTS

| 8,964,079 B2* | 2/2015 | Fukuda ............. H01L 27/14605 348/272 |
| 9,001,262 B2* | 4/2015 | Onuki ................ H04N 5/23212 348/352 |
| 9,456,119 B2* | 9/2016 | Hamano ............ H04N 5/23212 |
| 10,412,349 B2* | 9/2019 | Hwang ............. H01L 27/14605 |
| 2011/0096212 A1* | 4/2011 | Oikawa .................. G03B 13/36 348/273 |
| 2016/0073016 A1* | 3/2016 | Ohya ................ H01L 27/14621 348/207.1 |
| 2017/0171470 A1* | 6/2017 | Sakioka ............... H04N 5/3572 |

* cited by examiner

*Primary Examiner* — Nhan T Tran
(74) *Attorney, Agent, or Firm* — Hamilton, Brook, Smith & Reynolds. P.C-

(57) ABSTRACT

A camera system is provided to increase a baseline. The camera system includes a single lens, and an image sensor includes at least one pixel array, each of the at least one pixel array including a plurality of pixels in a two-dimensional arrangement and a single microlens disposed on the plurality of pixels to be shared. Light shielding layers formed with Offset Pixel Apertures (OPAs) are disposed on at least two pixels of the plurality of pixels, and the OPAs are formed on the light shielding layers to maximize a spaced distance between the OPAs.

16 Claims, 10 Drawing Sheets

CAMERA SYSTEM FOR INCREASING BASELINE

CROSS-REFERENCE TO RELATED APPLICATIONS

A claim for priority under 35 U.S.C. § 119 is made to Korean Patent Application No. 10-2018-0055407 filed on May 15, 2018, in the Korean Intellectual Property Office, the entire contents of which are hereby incorporated by reference.

BACKGROUND

Embodiments of the inventive concept described herein relate to a camera system for calculating a depth for a subject using a disparity, and more particularly, relate to a camera system including a structure in which a baseline increases to improve a calculated depth range.

A method of calculating a depth for a subject which is referred to as a distance between a camera system (more precisely, an image sensor included in the camera system) and the subject includes a method using a blur change between images obtained through a plurality of apertures of the camera system and a method using a disparity.

In detail, the conventional method using the disparity includes configuring a stereo camera system including two lenses and an image sensor, respectively processing an optical signal introduced through the two lenses to obtain two images having the disparity, and calculating the depth for the subject based on the disparity of the two images through a formula.

However, according to the conventional method using the disparity, because one camera system is implemented with the two lenses, it is difficult to miniaturize the camera system due to wide cross-sectional area. A length of a baseline of the camera system is short and the disparity between the images is reduced, thereby lowering a range of the calculated depth.

Thus, a technique for solving disadvantages and problems of the conventional method using the disparity in the camera system is required.

SUMMARY

Embodiments of the inventive concept provide a camera system having a structure for solving drawback that it is difficult to downsize due to a wide cross-sectional area thereof and problem that a range of a depth calculated is reduced due to a small disparity between images.

In detail, embodiments provide a miniaturized structure for minimizing the cross-sectional area of the camera system by applying Offset Pixel Apertures (OPAs) to pixels included in an image sensor.

In addition, embodiments provide a structure for increasing the baseline of the camera system to increase the disparity between the images and for improving the calculated depth range, by maximizing a spaced distance between the OPAs.

According to an exemplary embodiment, a camera system includes a single lens, and an image sensor that includes at least one pixel array, the at least one pixel array including a plurality of pixels in a two-dimensional arrangement and a single microlens disposed on the plurality of pixels to be shared. Light shielding layers formed with Offset Pixel Apertures (OPAs) may be disposed on at least two pixels of the plurality of pixels, respectively, and the OPAs may be formed on the light shielding layers to maximize a spaced distance therebetween.

According to an aspect, the at least two pixels may be disposed on the at least one pixel array to maximize the spaced distance between the OPAs, thereby increasing a baseline of the camera system.

According to another aspect, the at least two pixels may be disposed on the at least one pixel array in a diagonal direction to maximize the spaced distance between the OPAs.

According to still another aspect, an offset f-number associated with the spaced distance between the OPAs and each height of the at least two pixels may be larger than an f-number of the single lens.

According to still another aspect, the at least two pixels may be at least two pixels having maximum light transmission characteristics among the plurality of the pixels.

According to still another aspect, the at least two pixels may be W (white) pixels processing a W optical signal.

According to still another aspect, the OPAs may have centers shifted from centers of the at least two pixels, respectively.

According to still another aspect, the camera system may further include at least one processor calculating a depth for a subject using disparity between at least two images obtained through the at least two pixels where the light shielding layers formed with the OPAs are disposed, respectively.

According to an exemplary embodiment, a camera system includes a single lens, and an image sensor that includes a plurality of pixel arrays, each of the plurality of pixel arrays including a plurality of pixels in a two-dimensional arrangement and a single microlens disposed on the plurality of pixels to be shared. Light shielding layers formed with Offset Pixel Apertures (OPAs) may be disposed on a pixel included in a first pixel array of the plurality of the pixel arrays and a pixel included in a second pixel array of the plurality of the pixel arrays, respectively, and the OPAs may be formed on the light shielding layers to maximize a spaced distance between the OPAs.

According to an aspect, the pixel included in the first pixel array and the pixel included in the second pixel array may be disposed on the first pixel array and the second pixel array to maximize the spaced distance between the OPAs, thereby increasing a baseline of the camera system.

According to another aspect, the pixel included in the first pixel array and the pixel included in the second pixel array may be disposed on the first pixel array and the second pixel array in a diagonal direction to maximize the spaced distance between the OPAs.

According to still another aspect, the pixel included in the first pixel array and the pixel included in the second pixel array may be disposed on the first pixel array and the second pixel array in a horizontal direction to maximize the spaced distance between the OPAs when the first pixel array and the second pixel array are disposed in the horizontal direction.

According to still another aspect, the pixel included in the first pixel array and the pixel included in the second pixel array may be disposed on the first pixel array and the second pixel array in a vertical direction to maximize the spaced distance between the OPAs when the first pixel array and the second pixel array are disposed in the vertical direction.

According to still another aspect, an offset f-number associated with the spaced distance between the OPAs and height of each of the pixel included in the first pixel array and the pixel included in the second pixel array is larger than an f-number of the single lens.

According to still another aspect, the pixel included in the first pixel array and the pixel included in the second pixel array may be at least two pixels having maximum light transmission characteristics among a plurality of the pixels included in the first pixel array and a plurality of the pixels included in the second pixel array.

According to still another aspect, the pixel included in the first pixel array and the pixel included in the second pixel array may be W (white) pixels processing a W optical signal.

According to still another aspect, the OPAs may have centers shifted from centers of the pixel included in the first pixel array and the pixel included in the second pixel array, respectively.

According to still another aspect, the camera system may further include at least one processor calculating a depth for a subject using disparity between at least two images obtained through the pixel included in the first pixel array and the pixel included in the second pixel array

BRIEF DESCRIPTION OF THE FIGURES

The above and other subjects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings. However, the inventive concept is not limited to or limited by the embodiments. In addition, the same reference numerals shown in the drawings denote the same members.

Further, terms used in this specification are terms used to appropriately express the preferred embodiment of the inventive concept, and this may vary depending on the audience, the intention of the operator, or the practice of the field to which the present invention belongs. Therefore, the definitions of these terms should be based on the contents throughout this specification. For example, in the present specification, the singular forms include plural forms unless otherwise specified in the specification. It will be further understood that the terms "comprises" and/or "comprising," when used in this specification, specify the presence of stated elements, steps, operations, and/or devices, but do not preclude the presence or addition of one or more other elements, steps, operations, and/or devices It should also be understood that the various embodiments of the inventive concept are different, but need not be mutually exclusive. For example, certain features, structures, and characteristics described herein may be implemented in other embodiments without departing from the spirit and scope of the invention in connection with one embodiment. It is also to be understood that the position, arrangement, or configuration of individual components in the respective embodiments may be varied without departing from the spirit and scope of the present invention.

Each depth of pixels included in a two-dimensional image may be calculated to obtain a three-dimensional image with the depth. In this case, the conventional methods of calculating the depth of each of the pixels included in the two-dimensional image include a time of flight (TOF) method in which a laser beam irradiates a subject to be shot and time when the laser beam returns is measured, a depth-from-stereo method in which a depth using a disparity between images respectively obtained from two or more camera systems is calculated, a method (a disparity method using dual aperture, DA) of calculating the depth using the disparity between images obtained by processing an optical signal passing through each of a plurality of apertures formed in a single lens in a single camera system, and a method of calculating the depth using a blur change between images obtained by processing the optical signal passing through each of the plurality of apertures formed in the single lens in the single camera system.

A camera system according to an embodiment is based on the method using the disparity between the images among the conventional methods but an offset pixel aperture is applied to pixels of a pixel array included in the image sensor instead of forming a plurality of apertures at the single lens, and therefore the cross-sectional area is minimalized, thereby miniaturizing the camera system.

In particular, the camera system according to an embodiment allows a spaced distance between the OPAs to be maximized so that a baseline is increased to increase the disparity between the images, thereby improving a range of the calculated depth.

Figure 1:
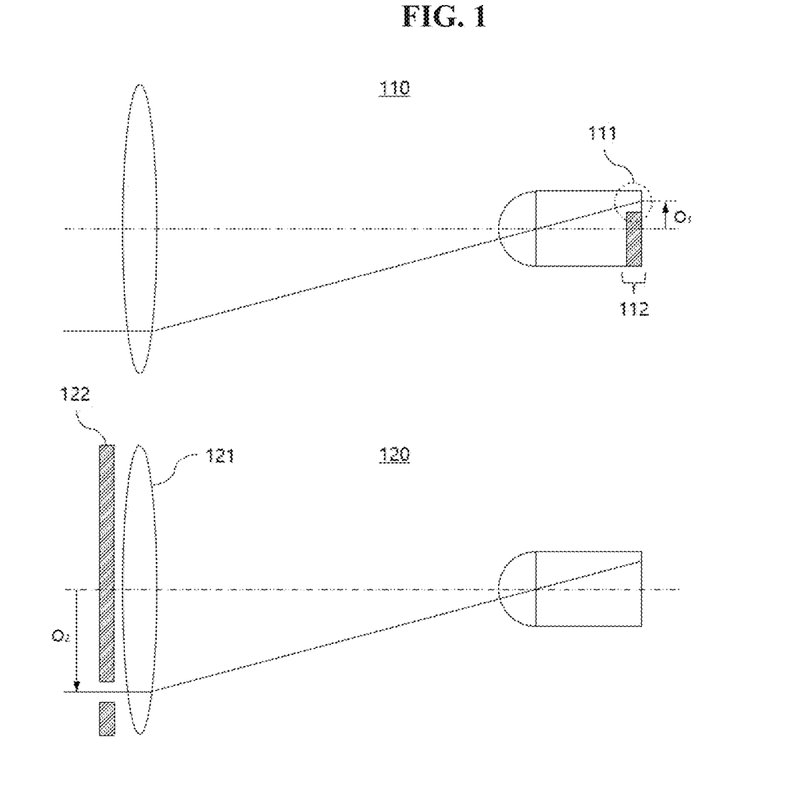
FIG. 1 is a view illustrating a relationship between a camera system according to an embodiment and a camera system with an aperture applied to a single lens.
Figure 2:
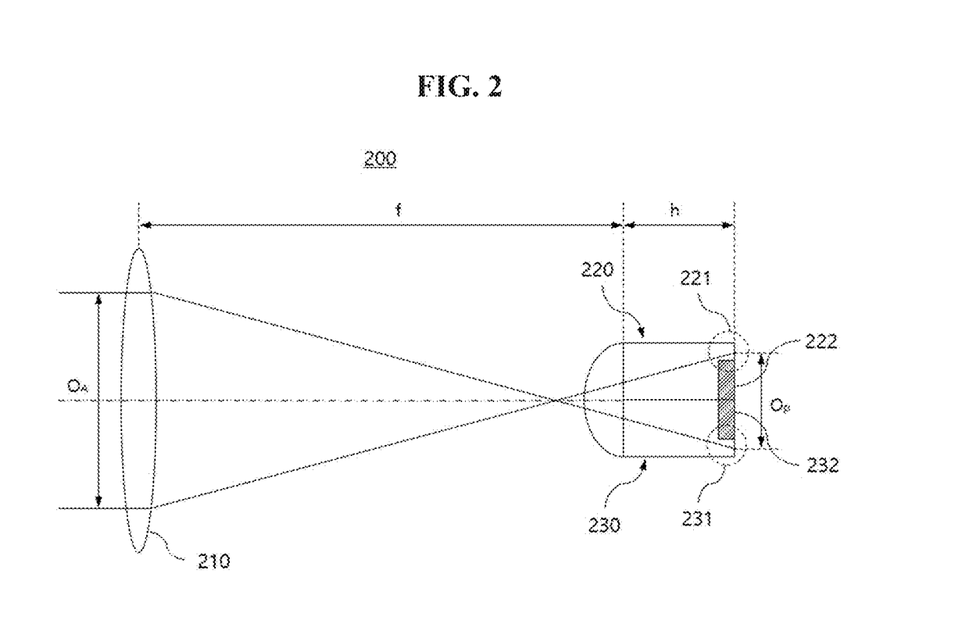
FIG. 2 is a view illustrating a principle of depth calculation in a camera system according to an embodiment.
Figure 3:
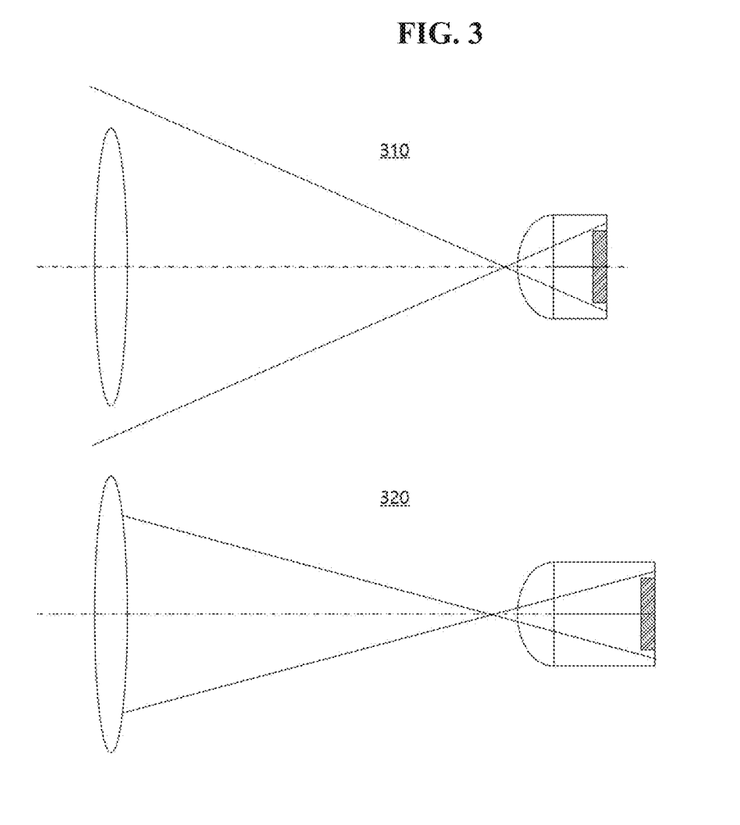
FIG. 3 is a view illustrating limitation of a camera system according to an embodiment.

FIG. 1 is a view illustrating a relationship between a camera system according to an embodiment and a camera system with an aperture applied to a single lens, FIG. 2 is a view illustrating a principle of depth calculation in a camera system according to an embodiment, and FIG. 3 is a view illustrating limitation of a camera system according to an embodiment. Hereinafter, FIG. 1 is described with one pixel to which an OPA is applied in the camera system according to an embodiment for the sake of convenience of explanation but the camera system according to an embodiment as illustrated in FIG. 2 is based on an image sensor including two pixels to which OPAs are applied.

Referring to FIG. 1, in a camera system 110 according to an embodiment, a light shielding layer 112 formed with OPA 111 is disposed at a pixel included in a pixel array of the image sensor. In this case, an offset distance $O_1$ where a center of the OPA 111 is offset from a center of the pixel is proportional to an offset distance $O_2$ where a center of an aperture 122 in the camera system (the conventional camera system) 120 where the aperture 122 is formed in a single lens 121 is offset from a center of the single lens 121.

Thus, the OPA 111 having the center shifted from the center of the pixel corresponds to the aperture 122 formed on the single lens 121 to have a center shifted from a center of the single lens 121. Therefore, the camera system 110 according to an embodiment may calculate a depth for a subject using a depth calculation formula with a disparity method using conventional DA.

More specifically, referring to FIG. 2, in a camera system 200 according to an embodiment, parameters $F_{OA}$ $$\left(F_{OA} \equiv \frac{f}{O_A}\right)$$

associated with a diameter $O_A$ of a single lens 210 and a focal length F are proportional to a height h of each of pixels 220 and 230 and a spaced distance $O_P$ where the OPAs are spaced apart from each other $$\left(F_{OA} \propto \frac{h}{O_P}\right)$$

because the diameter $O_A$ of the single lens 210 is proportional to the spaced distance $O_P$ where the OPAs are spaced apart from each other (more precisely, the spaced distance between a center of a first OPA 221 and a center of a second OPA 231) and the height h of each of the pixels 220 and 230 where light shielding layers 222 and 232 formed with the OPAs 221 and 231 are disposed. Therefore, the camera system 200 according to an embodiment may calculate the depth for the subject using Equation 1 below based on the depth calculation formula of the disparity method using the conventional DA.

$$ds = \frac{f^2(a - a_0)}{a(a_0 - f)F_{OA}} \qquad \langle\text{Equation 1}\rangle$$

In Equation 1, in the image sensor of the camera system 200 according to an embodiment, "ds" refers to the disparity between the images obtained through the two pixels 220 and 230 where the OPAs 221 and 231 are disposed, "f" refers to the focal length, "a" refers to a subject distance (a distance from the subject to a first principal plane of the single lens of the camera system, corresponding to the depth for the subject), "$a_0$" refers to a subject distance focused on the image sensor, and "$F_{OA}$" refers to a parameter associated to the diameter $O_A$ of the single lens 210 and the focal length f.

In this case, when the parameter $F_{OA}$ associated to the diameter $O_A$ of the single lens 210 and the focal length f is smaller than an f-number of the single lens included in the camera system 200, as in a case of 310 shown in FIG. 3, it is impossible to shoot an image. Hence, $F_{OA}$ should be larger than the f-number of the single lens 210 as in the case of 320.

Meanwhile, Equation 2 ("d" refers to a pixel size in Equation 2) representing the disparity for each pixel and being derived from Equation 1 may be expressed as Equation 3 below because the focal length f is proportional to a size of the pixel array configuring the pixels and a Field Of View $$(FOV)\left(f \propto \frac{\text{sensor size}}{FOV}\right).$$

$$ds/\text{pixel} = \frac{f^2(a - a_0)}{a(a_0 - f)F_{OA}d} \qquad \langle\text{Equation 2}\rangle$$

$$ds/\text{pixel} \propto \frac{(\text{sensor size})^2}{FOV^2 \cdot F_{OA} \cdot (\text{pixel size})} \qquad \langle\text{Equation 3}\rangle$$

Thus, in the camera system 200, $F_{OA}$ is proportional to the spaced distance between OPAs 221 and 231 and the height of each of the pixels 220 and 230 where the light shielding layers 222 and 232 formed with the OPAs 221 and 231 are disposed $$\left(F_{OA} \propto \frac{\text{pixel height}}{\text{OPA offset}}\right).$$

Namely, limitation that the above-described $F_{OA}$ should be larger than the f-number of the single lens in the case of 320 refers to limitation that an offset f-number $F_{OA}$ associated with the spaced distance between the OPAs 221 and 231 and the height of each of the pixels 220 and 230 to which the OPAs are applied should be larger than the f-number of the single lens 210. When the camera system 200 according to an embodiment described below satisfies the associated limitation, the camera system 200 has a structure in which the spaced distance between the OPAs 221 and 231 is maximized. A detailed description thereof will be described below.

Figure 4:
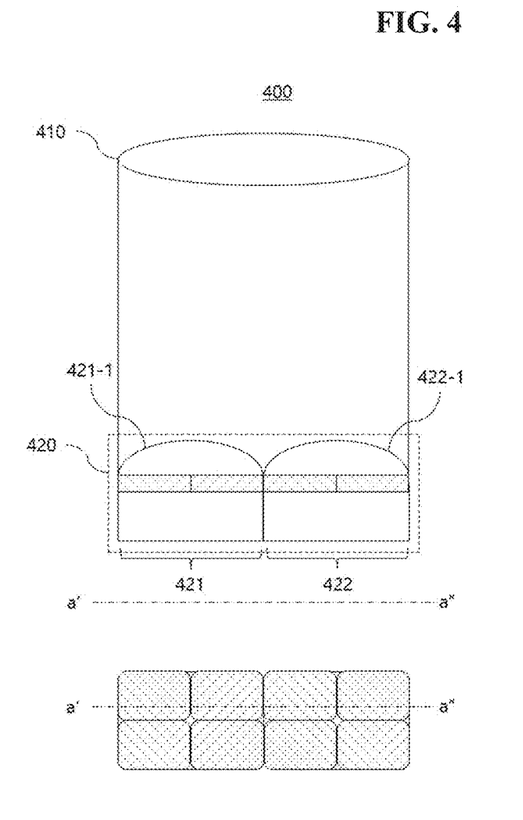
FIG. 4 is a view illustrating a camera system according to an embodiment.

FIG. 4 is a view illustrating a camera system according to an embodiment.

Referring to FIG. 4, a camera system 400 according to an embodiment includes a single lens 410 and an image sensor 420 disposed at a lower portion of the single lens 410. Here, the image sensor 420 includes at least one pixel arrays 421 and 422. Each of the at least one of the pixel arrays 421 and 422 includes a plurality of pixels (e.g., four pixels of a 2×2 arrangement) in a two-dimensional arrangement and single microlenses 421-1 and 422-1 disposed on the plurality of pixels to be shared.

The camera system 400 of the structure described above according to an embodiment, where the OPAs are applied to the pixels as described above, may calculate the depth for the subject based on a disparity between the images obtained through the pixels similar to the case where the DA is applied to the single lens 410 and may be miniaturized by minimizing the cross-sectional area of the camera system 400 as compared with the case where DA is applied to the single lens 410. Here, a depth calculation operation may be performed in at least one processor (not shown in the drawings) further included in the camera system 400.

In addition, the camera system 400 according to an embodiment allows the plurality of pixels to share the single microlenses 421-1 and 422-1 so that the baseline may be increased more than when each of the plurality of pixels is provided with the microlens. In particular, the OPAs are formed and arranged on the pixels to maximize the spaced distance between the OPAs so that the baseline may be increased. Thus, the camera system 400 may increase the baseline to allow the disparity between the images to be increased and may improve the range of the depth to be calculated.

The detailed structure of the at least one pixel array 421 and 422 of the camera system 400 according to an embodiment will be described below.

Figure 5:
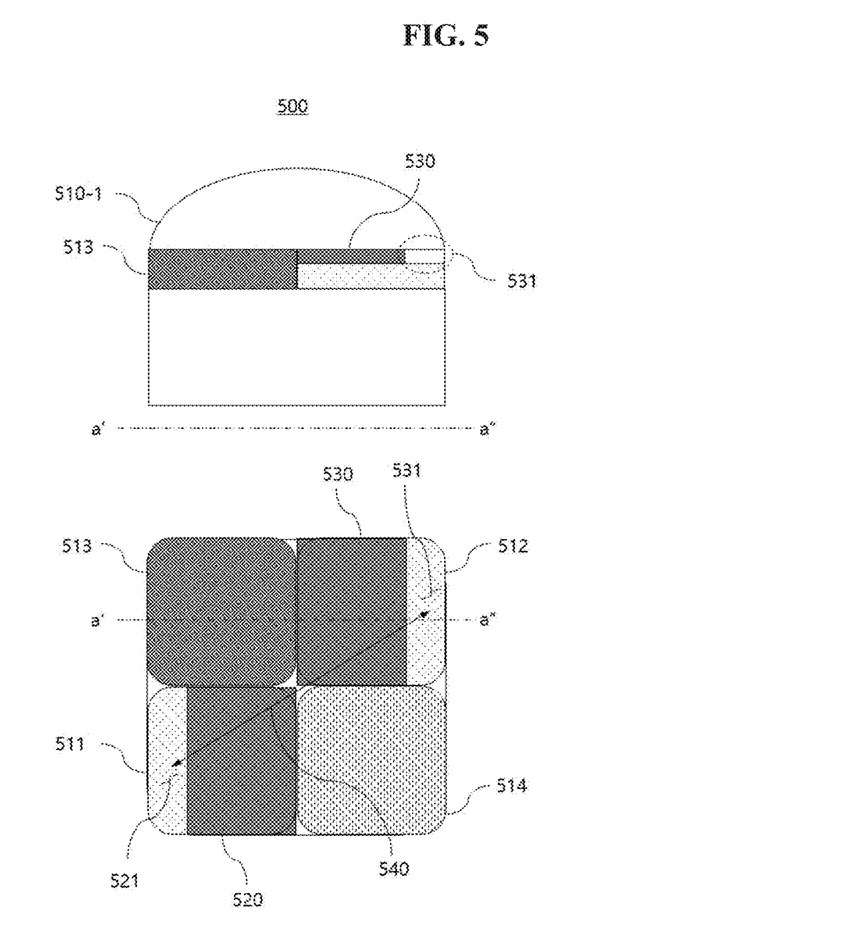
FIG. 5 is a view illustrating a pixel array included in an image sensor of a camera system according to an embodiment.
Figure 6:
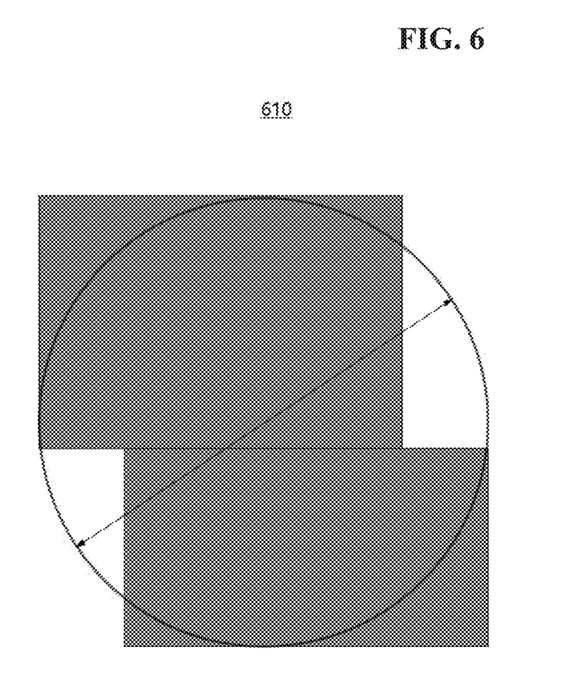
FIG. 6 is a view illustrating a lens aperture equivalent to a pixel array including a pixel to which an OPA is applied shown in FIG. 5

FIG. 5 is a view illustrating a pixel array included in an image sensor of a camera system according to an embodiment and FIG. 6 is a view illustrating a lens aperture equivalent to the pixel array including the pixels to which the OPAs are applied as shown in FIG. 5.

Referring to FIG. 5, a pixel array 500 included in the image sensor of the camera system according to an embodiment corresponds to one pixel array 421 shown in FIG. 4. Hereinafter, the pixel array 500 is described as including a plurality of pixels 511, 512, 513, and 514 in a 2×2 arrangement, which share a single microlens 510-1, but is not limited thereto. The pixel array 500 may include the plurality of pixels in various two-dimensional arrangements such as a 3×3 arrangement or a 4×4 arrangement.

Light shielding layers 520 and 530 formed with OPAs 521 and 531 are respectively formed on each of at least two pixels 511 and 512 of the plurality of pixels 511, 512, 513 and 514 of the pixel array 500. In particular, the OPAs 521 and 531 are formed on the light shielding layers 520 and 530, respectively, to maximize a spaced distance 540 between the OPAs 521 and 531. For example, the OPA 521 of the first pixel 511 and the OPA 531 of the second pixel 512 may be disposed on each of the light shielding layers 520 and 530 and may be respectively formed at a left end of the first pixel 511 and a right end of the second pixel 512 in a diagonal direction, as shown in FIG. 5, thereby maximizing the spaced distance 540.

In addition, for increasing the baseline of the camera system, the at least two pixels 511 and 512 may be disposed on the pixel array 500 to maximize the spaced distance 540 between OPAs 521 and 531 (it means that the at least two pixels 511 and 512 where the light shielding layers 520 and 530 formed with the OPAs 521 and 531 are disposed respectively are selected among the plurality of pixels 511, 512, 513, and 514 to maximize the spaced distance 540 between the OPAs 521 and 531). For example, the first pixel 511 and the second pixel 512 may be pixels that are positioned diagonally on the pixel array 500 to maximize the spaced distance 540 between the OPAs 521 and 531. Thus, the OPA 521 of the first pixel 511 and the OPA 531 of the second pixel 512 may be arranged in a diagonal direction in the pixel array 500 to maximize the spaced distance 540.

As described above, the camera system including the pixel array 500 to which the OPAs 521 and 531 are applied is the same as the equivalent lens aperture 610 shown in FIG. 6, thereby having the increased baseline.

However, without being limited thereto, the OPAs 521 and 531 may be spaced apart from each other in a horizontal direction or a vertical direction, not in the diagonal direction. In this case, the at least two pixels 511 and 512 to which OPAs 521 and 531 are applied may also be pixels that are disposed either horizontally or vertically on the pixel array 500.

As described above, selection of the at least two pixels 511 and 512 where the light shielding layers 520 and 530 formed with the OPAs 521 and 531 are disposed respectively among the plurality of pixels 511, 512, 513 and 514 and determination of positions where the OPAs 521 and 531 are respectively formed on the light shielding layers 520 and 530 may be performed to maximize a length of the baseline of the camera system, which satisfies the limitation described above with reference to FIG. 3. For example, when the limitation that the offset f-number $$\left(F_{OA} \propto \frac{\text{pixel height}}{\text{OPA offset}}\right)$$

associated with the spaced distance 540 between the OPAs 521 and 531 and each height of the at least two pixels 511 and 521 to which the OPAs are applied is larger than the f-number of the single lens of the camera system is satisfied, the at least two pixels 511 and 512 where the light shielding layers 520 and 530 are disposed may be selected among the plurality of pixels 511, 512, 513, and 514 and the positions where the OPAs 521 and 531 are respectively formed on the light shielding layers 520 and 530 may be determined to maximize the spaced distance between the OPAs 521 and 531. Here, with respect to the characteristics of the offset f-number, when the spaced distance 540 between the OPAs 521 and 531 is increased and each height of the at least two pixels 511 and 512 to which the OPAs 521 and 531 are applied is also increased proportionally, the size of the offset f-number may be maintained without decreasing. Thus, in the camera system according to an embodiment, the at least two pixels 511 and 512 are disposed on the pixel array 500 to maximize the spaced distance 540 between the OPAs 521 and 531, the OPAs 521 and 531 are respectively formed on the light shielding layers 520 and 530 to maximize the spaced distance 540, and each height of the at least two pixels 511 and 512 to which the OPAs 521 and 531 are applied is increased, thereby satisfying the limitation that the offset f-number is larger than the f-number of the single lens.

In this case, the OPAs 521 and 531 may be formed on the light shielding layers 520 and 530 to have centers shifted from centers of the at least two pixels 511 and 512, respectively. For example, a first OPA 521 has a center shifted to a left side with regard to the center of the first pixel 511, and a second OPA 531 has a center shifted to a right side with regard to the center of the second pixel 512 so that the first OPA 521 and the second OPA 531 may have the offset centers, respectively. Thus, there is the disparity between the images obtained through the at least two pixels 511, 512, and therefore the camera system may calculate the depth for the subject based on the disparity between the images.

As described above, each of the at least two pixels 511 and 512 to which the OPAs 521 and 531 are applied may be a pixel having maximum light transmittance characteristics among the plurality of pixels 511, 512, 513, and 514. For example, as shown in FIG. 5, the at least two pixels 511 and 512 may be W pixels that processes a W (White) optical signal. On the other hand, other pixels 513 and 514 except for the at least two pixels 511 and 512 to which the OPAs 521 and 531 are applied among the plurality of pixels 511, 512, 513 and 514, may be color pixels (e.g., two pixels of R pixels, G pixels, and B pixels) that process a color optical signal. However, without being limited thereto, the other pixels 513 and 514 may also be W pixels.

The camera system including the image sensor including at least one pixel array 500 having the structure describe above and the single lens may calculate the depth for the subject based on the disparity between the images obtained through the pixels 511 and 512 to which the OPAs 521 and 531 are applied, the camera system may be miniaturized by minimizing the cross-sectional area thereof as compared with the case where the DA is applied to the single lens, and the plurality of pixels 511, 512, 513, and 514 share the single microlens 510-1 and the OPAs 521 and 531 are formed and disposed on the pixels 511 and 512 to maximize the spaced distance 540 between the OPAs 521 and 531, thereby increasing the baseline.

Figure 7:
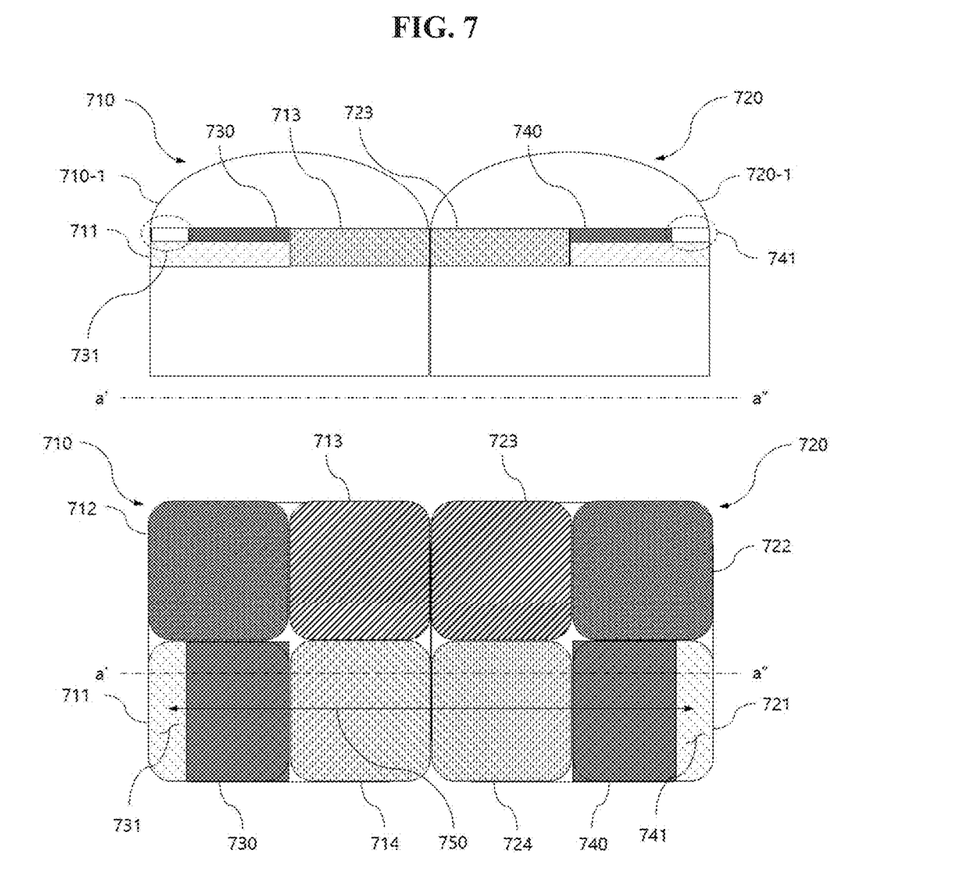
FIG. 7 is a view illustrating pixel arrays included in an image sensor of a camera system according to another embodiment.
Figure 8:
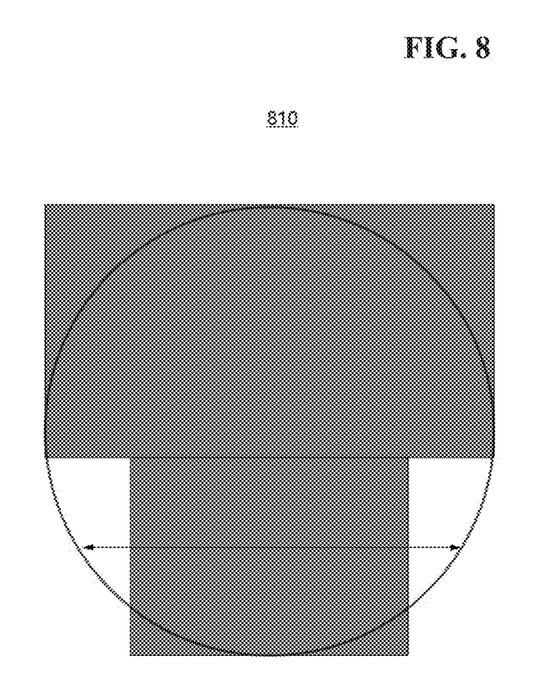
FIG. 8 is a view illustrating a lens aperture equivalent to pixel arrays including pixels to which OPAs are applied shown in FIG. 7.

FIG. 7 is a view illustrating pixel arrays included in an image sensor of a camera system according to another embodiment and FIG. 8 is a view illustrating a lens aperture equivalent to the pixel arrays including pixels to which the OPAs are applied as shown in FIG. 7.

Referring to FIG. 7, a plurality of pixel arrays 710 and 720 included in the image sensor of the camera system according to another embodiment corresponds to the two pixel arrays 421 and 422 illustrated in FIG. 4. Hereinafter, each of the plurality of pixel arrays 710 and 720 includes a plurality of pixels 711, 712, 713, 714, 721, 722, 723, and 724 in a 2×2 arrangement, which share one single microlens 710-1 and 720-2, but is not limited thereto. Each of the plurality of pixel arrays 710 and 720 may include the plurality of pixels in various two-dimensional arrangements such as a 3×3 arrangement or a 4×4 arrangement.

Light shielding layers 730 and 740 formed with OPAs 731 and 741 are disposed on one pixel 711 include in a first pixel array 710 of the plurality of pixel arrays 710 and 720 and one pixel 721 included in a second pixel array 720 of plurality of pixel arrays 710 and 720, respectively. In particular, the OPAs 731 and 741 may be respectively formed on the light shielding layers 730 and 740 to maximize a spaced distance 750 therebetween. For example, the OPA 731 of the first pixel 711 included in the first pixel array 710 and the OPA 741 of the second pixel 721 included in the second pixel array 720 may be disposed on each of the light shielding layers 730 and 740 and may be respectively formed at a left end of the first pixel 711 and a right end of the second pixel 721 in a horizontal direction, as shown in FIG. 7, thereby maximizing the spaced distance 750.

In addition, for increasing the baseline of the camera system, the one pixel 711 included in the first pixel array 710 and the one pixel 721 included in the second pixel array 720 may be disposed on the first pixel array 710 and the second pixel array 720 to maximize the spaced distance 750 between the OPAs 731 and 741 (it means that two pixels 711 and 721 where the light shielding layers 730 and 740 formed with the OPAs 731 and 741 are applied are selected among the plurality of pixels 711, 712, 713, and 714 of the first pixel array 710 and the plurality of pixels 721, 722, 723, and 724 of the second pixel array 720 to maximize the spaced distance 750 between the OPAs 731 and 741). For example, when the first pixel array 710 and the second pixel array 720 are arranged horizontally on the image sensor, the first pixel 711 and the second pixel 721 may be pixels which are arranged on the first pixel array 710 and the second pixel array 720 in a horizontal direction to maximize the spaced distance 750 between the OPAs 731 and 741. Thus, the OPA 731 of the first pixel 711 and the OPA 741 of the second pixel 721 may be arranged on the first pixel array 710 and the second pixel array 720 in the horizontal direction to maximize the spaced distance 750 therebetween.

As described above, the camera system including the first pixel array 710 and the second pixel array 720 to which the OPAs 731 and 741 are applied may be the same as the equivalent lens aperture 810 shown in FIG. 8, thereby having the increased baseline.

However, without being limited thereto, when the first pixel array 710 and the second pixel array 720 are arranged in a vertical direction, the first pixel 711 and the second pixel 721 may pixels which are vertically disposed on the first pixel array 710 and the second pixel array 720 to maximize the spaced distance 750 between the OPAs 731 and 741. Thus, the OPA 731 of the first pixel array 711 and the OPA 741 of the second pixel 721 are arranged in the vertical direction in the first pixel array 710 and the second pixel array 720, respectively, thereby maximizing the spaced distance 750.

As described above, selection of two pixels 711 and 721 where the light shielding layers 730 and 740 formed with the OPAs 731 and 741 are disposed among the plurality of pixels 711, 712, 713, and 714 of the first pixel array 710 and the plurality of pixels 721, 722, 723, and 724 of the second pixel array 720 and determination of positions where the OPAs 731 and 741 are respectively formed on the light shielding layers 730 and 740 may be performed to maximize the length of the baseline of the camera system, while satisfying the limitation described above with reference to FIG. 3. For example, when the limitation that the offset f-number $$\left(F_{OA} \propto \frac{\text{pixel height}}{\text{OPA offset}}\right)$$

associated with the spaced distance 750 between the OPAs 731 and 741 and each height of the two pixels (the one pixel 711 of the plurality of pixels 711, 712, 713, and 714 of the first pixel array 710 and the one pixel 721 of the plurality of pixels 721, 722, 723, 724 of the second pixel array 720) to which the OPAs 731 and 741 are applied is larger than the f-number of the single lens of the camera system is satisfied, the one pixel 711 where the light shielding layer 730 is disposed may be selected among the plurality of pixels 711,712, 713, and 714 of the first pixel array 710, the one pixel 721 where the light shielding layer 740 is disposed may be selected among the plurality of pixels 721, 722, 723, and 724 of the second pixel array 720, and the positions where the OPAs 731 and 741 are formed on the light shielding layers 730 and 740, respectively, may be determined to maximize the spaced distance 750 between the OPAs 731 and 741. Here, with regard to the characteristic of the offset f-number, when the spaced distance 750 between the OPAs 731 and 741 is increased and each height of the two pixels 711 and 721 to which the OPAs 731 and 741 are applied is proportionally increased, the size of the offset f-number may be maintained without decreasing. Thus, the one pixel 711 of the plurality of pixels 711, 712, 713, and 714 of the first pixel array 710 and the one pixel 721 of the plurality of pixels 721, 722, 723, 724 of the second pixel array 720 are disposed on the first pixel array 710 and the second pixel array 720 respectively, to maximize the spaced distance 750 between the OPAs 731 and 741, the OPAs are formed on the light shielding layers 730 and 740 respectively, to maximize the spaced distance 750, and each height of the two pixels 711 and 721 to which the OPAs 731 and 741 are applied is increased, thereby satisfying the limitation that the offset f-number is larger than the f-number of the single lens.

In this case, the OPAs 731 and 741 may be formed on the light shielding layers 730 and 740 to have centers shifted from centers of the one pixel 711 of the plurality of pixels 711, 712, 713, and 714 of the first pixel array 710 and the one pixel 721 of the plurality of pixels 721, 722, 723, 724 of the second pixel array 720, respectively. For example, the first OPA 731 has a center shifted to a left side with regard to a center of the first pixel 711 and the second OPA 741 has a center shifted to the right side with regard to a center of the second pixel 721 so that the first OPA 731 and the second OPA 741 may have the offset centers, respectively. Thus, there is the disparity between the images obtained through the two pixels 711 and 721, and therefore the camera system may calculate the depth for the subject based on the disparity between the images.

As described above, each of the at least two pixels 711 and 721 to which the OPAs 731 and 741 are applied may be a pixel having maximum light transmittance characteristics among the plurality of pixels 711, 712, 713, and 714 of included in the first pixel array 710 and the plurality of pixels 721, 722, 723, and 724 included in the second pixel array 720. For example, as shown in FIG. 7, the two pixels 711 and 721 may be W pixels that process a W optical signal. On the other hand, other pixels 712, 713, 714, 722, 723, and 724 except for the two pixels 711 and 721 to which the OPAs 731 and 741 are applied among the plurality of pixels 711, 712, 713, and 714 included in the first pixel array 710 and the plurality of pixels 721, 722, 723 and 724 included in the second pixel array 720 may be color pixels (e.g., two pixels of R pixels, G pixels, and B pixels) which process a color optical signal. However, without being limited thereto, the other pixels 712, 713, 714, 722, 723, and 724 may also be W pixels.

The camera system including the image sensor including the plurality of pixel arrays 710 and 720 of the structure described above and the single lens may calculate the depth for the subject based on the disparity between the images obtained through the pixels 711 and 721 to which the OPAs 731 and 741 are applied, the camera system may be miniaturized by minimizing the cross-sectional area thereof as compared with the case where the DA is applied to the single lens, and the plurality pixels 712, 713, 714 or 721, 722, 723, 724 share the single microlens 710-1, 720-1 for each of the pixel arrays 710 and 720 and the OPAs 731, 741 are formed and disposed on each of the pixels 711 and 721 of the plurality of pixel arrays 710 and 720 to maximize the spaced distance 750 between the OPAs 731 and 741, thereby increasing the baseline as compared with the camera system described with reference to FIG. 5.

Figure 9:
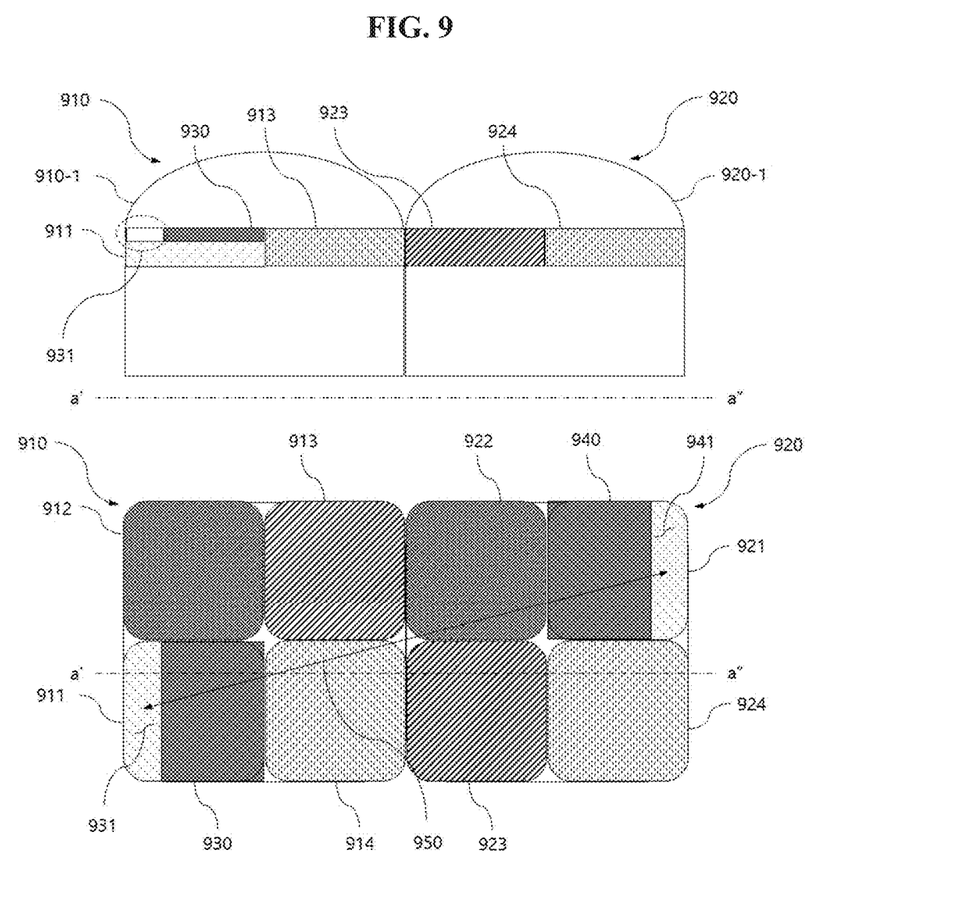
FIG. 9 is a view illustrating pixel arrays included in an image sensor of a camera system according to another embodiment.
Figure 10:
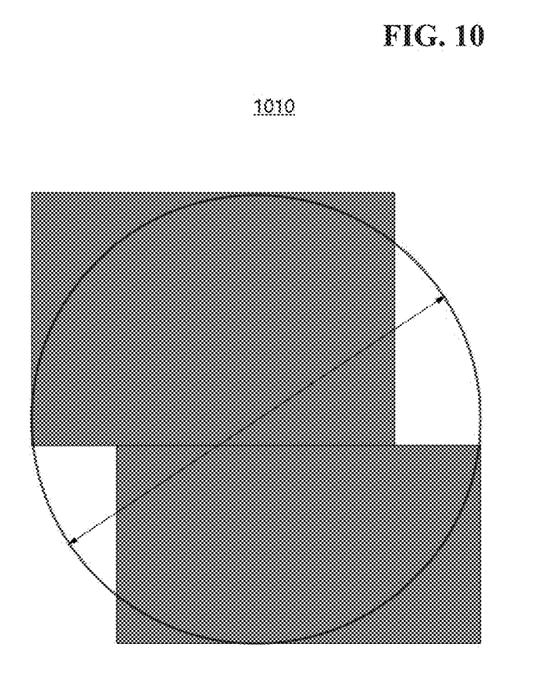
FIG. 10 is a view illustrating a lens aperture equivalent to pixel arrays including pixels to which OPAs are applied shown in FIG. 9.

FIG. 9 is a view illustrating pixel arrays included in an image sensor of a camera system according to another embodiment and FIG. 10 is a view illustrating a lens aperture equivalent to the pixel arrays including the pixels to which the OPAs are applied as shown in FIG. 9.

A plurality of pixel arrays 910 and 920 included in the image sensor of the camera system according to another embodiment shown in FIG. 9 has a structure similar to the plurality of the pixel arrays included in the image sensor of the camera system according to another embodiment, which described with reference to FIG. 7. However, there is a difference in which an OPA 931 of one pixel 911 included in the first pixel array 910 of the plurality of pixel arrays 910 and 920 and an OPA 941 of one pixel 921 included in the second pixel array 920 of the plurality of pixel arrays 910 and 920 are formed on light shielding layers 930 and 940 in a diagonal direction at a left end of the one pixel 911 and a right end of the one pixel 921, respectively, to maximize a spaced distance 950 between the OPAs 931 and 941.

Likewise, the one pixel 911 included in the first pixel array 910 and the one pixel 921 included in the second pixel array 920 may be respectively disposed on the first pixel array 910 and the second pixel array 920 in the diagonal direction to maximize the spaced distance 950 between the OPAs 931 and 941, thereby increasing the baseline of the camera system (it means that the two pixels 911 and 921 where the light shielding layers 930 and 940 formed with the OPAs 931 and 941 are disposed are selected among a plurality of pixels 911, 912, 913, and 914 of the first pixel array 910 and a plurality of pixels 921, 922, 923, and 924 of the second pixel array 920 and are disposed in the diagonal direction to maximize the spaced distance 950 between the OPAs 931 and 941).

As described above, the camera system including the first pixel array 910 and the second pixel array 920 to which the OPAs 931 and 941 are applied may be the same as an equivalent lens aperture 1010 shown in FIG. 10, thereby having the increased baseline.

As described above, selection of two pixels 911 and 921 where the light shielding layers 930 and 940 formed with the OPAs 931 and 941 are disposed among the plurality of pixels 911, 912, 913, and 914 of the first pixel array 910 and the plurality of pixels 921, 922, 923, and 924 of the second pixel array 920 and determination of positions where the OPAs 931 and 941 are formed on the light shielding layers 930 and 940, respectively, may be performed to maximize the length of the baseline of the camera system, which satisfies the limitation described above with reference to FIG. 3. For example, when the limitation that an offset f-number $$\left(F_{OA} \propto \frac{\text{pixel height}}{\text{OPA offset}}\right)$$

associated with the spaced distance 950 between the OPAs 931 and 941 and each height of two pixels (the one pixel 911 among the plurality of pixels 911, 912, 913, and 914 of the first pixel array 910 and the one pixel 921 among the plurality of pixels 921, 922, 923, and 924 of the second pixel array 920) to which the OPAs 931 and 941 are applied is larger than the f-number of the single lens of the camera system is satisfied, the one pixel 911 where the light shielding layer 930 is disposed may be selected among the plurality of pixels 911, 912, 913, and 914 of the first pixel array 910, the pixel 921 where the light shielding layer 940 is disposed may be selected among the plurality of pixels 921, 922, 923, and 924 of the second pixel array 920, and each position where the OPAs 931 and 941 are formed on the light shielding layers 930 and 940 may be determined to maximize the spaced distance 950 between the OPAs 931 and 941. Here, with respect to the characteristics of the offset f-number, when the spaced distance 950 between the OPAs 931 and 941 is increased and each height of the two pixels 911 and 921 to which the OPAs 931 and 941 are applied are proportionally increased, a size of the offset f-number may be maintained without decreasing. Thus, in the camera system according to another embodiment, the one pixel 911 of the plurality of pixels 911, 912, 913, and 914 of the first pixel array 910 and the one pixel 921 of the plurality of pixels 921, 922, 923, and 924 of the second pixel array 920 are disposed on the first pixel array 910 and the second pixel array 920, respectively, to maximize the spaced distance 950 between the OPAs 931 and 941, the OPAs 931 and 941 are formed on the light shielding layers 930 and 940, respectively to maximize the spaced distance 950, and each height of the two pixels 911 and 921 to which the OPAs 931 and 941 are applied is increased, thereby satisfying the limitation that the offset f-number is larger than the f-number of the single lens.

In this case, the OPAs 931 and 941 may be formed on the light shielding layers 930 and 940 to have centers shifted from centers of the one pixel 911 included in the first pixel array 910 and the one pixel 921 included in the second pixel array 920, respectively. For example, the first OPA 931 has a center shifted to a left side with regard to a center of the first pixel 911, and the second OPA 941 has a center shifted to a right side with regard to the center of the second pixel 921 so that the first OPA 931 and the second OPA 941 may have the offset centers, respectively. Thus, there is the disparity between the images obtained through the two pixels 911 and 921, and therefore the camera system may calculate the depth for the subject based on the disparity between the images.

As described above, each of the at least two pixels 911 and 922 to which the OPAs 931 and 941 are applied may be a pixel having maximum light transmittance characteristics among the plurality of pixels 911, 912, 913, and 914 included in the first pixel array 910 and the plurality of pixels 921, 922, 923, and 924 included in the second pixel array 920. For example, as shown in FIG. 9, the two pixels 911 and 921 may be W pixels that process a W optical signal. On the other hand, other pixels 912, 913, 914, 922, 923, and 924 except for the two pixels 911 and 921 to which the OPAs 931 and 941 are applied among the plurality of pixels 911, 912, 913, and 914 included in the first pixel array 910 and the plurality of pixels 921, 922, 923, and 924 included in the second pixel array 920 may be color pixels (e.g., two pixels of R pixel, G pixel, and B pixel) that process a color optical signal. However, without being limited thereto, the other pixels 912, 913, 914, 922, 923, and 924 may also be W pixels.

The camera system including the image sensor including the plurality of pixel arrays 910 and 920 of the above-described structure and the single lens may calculate the depth for the subject based on the disparity between the images obtained through the pixels 911 and 921 to which the OPAs 931 and 941 are applied, the camera system may be miniaturized by minimizing the cross-sectional area thereof as compared with the case where the DA is applied to the single lens, and the plurality of pixels 911, 912, 913, 914 or 921, 922, 923, 924 share single microlenses 910-1, 920-1 for each of the pixel arrays 910 and 920 and the OPAs 931 and 941 are formed and disposed on the pixels 911 and 921 for the plurality of the pixel arrays 910 and 920 in the diagonal direction to maximize the spaced distance 950 between the OPAs 931 and 941, thereby increasing the baseline as compared with the camera system described with reference to FIG. 7.

The foregoing devices may be realized by hardware components, software components and/or combinations thereof. For example, the devices and components illustrated in the embodiments of the inventive concept may be implemented in one or more general-use computers or special-purpose computers, such as a processor, a controller, an arithmetic logic unit (ALU), a digital signal processor, a microcomputer, a field programmable gate array (FPGA), a programmable logic unit (PLU), a microprocessor or any device which may execute instructions and respond. A processing unit may perform an operating system (OS) or one or software applications running on the OS. Further, the processing unit may access, store, manipulate, process and generate data in response to execution of software. It will be understood by those skilled in the art that although a single processing unit may be illustrated for convenience of understanding, the processing unit may include a plurality of processing components and/or a plurality of types of processing components. For example, the processing unit may include a plurality of processors or one processor and one controller. Also, the processing unit may have a different processing configuration, such as a parallel processor.

Software may include computer programs, codes, instructions or one or more combinations thereof and may configure a processing unit to operate in a desired manner or may independently or collectively control the processing unit. Software and/or data may embodied in any type of machine, components, physical equipment, virtual equipment, computer storage media or units so as to be interpreted by the processing unit or to provide instructions or data to the processing unit. Software may be dispersed throughout computer systems connected via networks and may be stored or executed in a dispersion manner. Software and data may be recorded in one or more computer-readable storage media.

The methods according to the above-described embodiments of the inventive concept may be implemented with program instructions which may be executed through various computer means and may be recorded in computer-readable media. The media may persistently store a computer-executable program or temporarily store the computer-executable program for the execution or downloading. The media may be various recording means or storage means formed by single hardware or formed the combination of several hardware. The media is not limited to media directly connected with a certain computer system, but distributed over a network. The media include magnetic media such as hard disks, floppy disks, and magnetic tape; optical media such as compact disc-read only memory (CD-ROM) disks and digital versatile discs (DVDs); magneto-optical media such as floptical disks; and hardware devices that are specially configured to store and perform program instructions, such as read-only memory (ROM), random access memory (RAM), flash memory, and the like. In addition, the media may include an App store, which distributes an application or recording/storage media managed in a site or a server which supplies or distributes software.

An embodiment may provide the camera system having the structure for solving drawback that it is difficult to downsize due to the wide cross-sectional area thereof and the problem that the range of the depth calculated by the small disparity between the images is reduced.

In detail, an embodiment may provide the miniaturized structure for minimizing the cross-sectional area of the camera system by applying the offset pixel apertures (OPAs) to the pixels included in the image sensor.

In addition, an embodiment may provide the structure for increasing the baseline of the camera system to increase the disparity between the images and for improving the calculated depth range, by maximizing the spaced distance between the OPAs.

While a few embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned components, such as systems, structures, devices, or circuits, are combined or coupled in different forms and modes than as described above or be substituted or switched with other components or equivalents.

Therefore, those skilled in the art can easily understand that various implementations, various embodiments, and equivalents shall be construed within the scope of the inventive concept specified in attached claims.

What is claimed is:

1. A camera system comprising:
   a single lens; and
   an image sensor including at least one pixel array, the at least one pixel array including a plurality of pixels in a two-dimensional arrangement and a single microlens disposed on the plurality of pixels to be shared,
   wherein light shielding layers formed with Offset Pixel Apertures (OPAs) are disposed on at least two pixels of the plurality of pixels, respectively,
   wherein the OPAs are formed on the light shielding layers to maximize a spaced distance between the OPAs; and
   wherein an offset f-number associated with the spaced distance between the OPAs and each height of the at least two pixels is larger than an f-number of the single lens.

2. The camera system of claim 1, wherein the at least two pixels are disposed on the at least one pixel array to maximize the spaced distance between the OPAs, thereby increasing a baseline of the camera system.

3. The camera system of claim 2, wherein the at least two pixels are disposed on the at least one pixel array in a diagonal direction to maximize the spaced distance between the OPAs.

4. The camera system of claim 1, wherein the at least two pixels are at least two pixels having maximum light transmission characteristics among the plurality of the pixels.

5. The camera system of claim 1, wherein the at least two pixels are W (white) pixels processing a W optical signal.

6. The camera system of claim 1, wherein the OPAs have centers shifted from centers of the at least two pixels, respectively.

7. The camera system of claim 2, further comprising:
   at least one processor calculating a depth for a subject using disparity between at least two images obtained through the at least two pixels where the light shielding layers formed with the OPAs are disposed, respectively.

8. A camera system comprising:
   a single lens; and
   an image sensor including a plurality of pixel arrays, each of the plurality of pixel arrays including a plurality of pixels in a two-dimensional arrangement and a single microlens disposed on the plurality of pixels to be shared,
   wherein light shielding layers formed with OPAs (Offset Pixel Apertures) are disposed on a pixel included in a first pixel array of the plurality of the pixel arrays and a pixel included in a second pixel array of the plurality of the pixel arrays, respectively,
   wherein the OPAs are formed on the light shielding layers to maximize a spaced distance between the OPAs, and
   wherein an offset f-number associated with the spaced distance between the OPAs and height of each of the pixel included in the first pixel array and the pixel included in the second pixel array is larger than an f-number of the single lens.

9. The camera system of claim 8, wherein the pixel included in the first pixel array and the pixel included in the second pixel array are disposed on the first pixel array and the second pixel array to maximize the spaced distance between the OPAs, thereby increasing a baseline of the camera system.

10. The camera system of claim 9, wherein the pixel included in the first pixel array and the pixel included in the second pixel array are disposed on the first pixel array and the second pixel array in a diagonal direction to maximize the spaced distance between the OPAs.

11. The camera system of claim 9, wherein the pixel included in the first pixel array and the pixel included in the second pixel array are disposed on the first pixel array and the second pixel array in a horizontal direction to maximize the spaced distance between the OPAs when the first pixel array and the second pixel array are disposed in the horizontal direction.

12. The camera system of claim 9, wherein the pixel included in the first pixel array and the pixel included in the second pixel array are disposed on the first pixel array and the second pixel array in a vertical direction to maximize the spaced distance between the OPAs when the first pixel array and the second pixel array are disposed in the vertical direction.

13. The camera system of claim 8, wherein the pixel included in the first pixel array and the pixel included in the second pixel array are at least two pixels having maximum light transmission characteristics among a plurality of the pixels included in the first pixel array and a plurality of the pixels included in the second pixel array.

14. The camera system of claim 5, wherein the pixel included in the first pixel array and the pixel included in the second pixel array are W (white) pixels processing an W optical signal.

15. The camera system of claim 8, wherein the OPAs have centers shifted from centers of the pixel included in the first pixel array and the pixel included in the second pixel array, respectively.

16. The camera system of claim 15, further comprising:
   at least one processor calculating a depth for a subject using disparity between at least two images obtained through the pixel included in the first pixel array and the pixel included in the second pixel array.

* * * * *